United States Patent [19]

Good et al.

[11] Patent Number: 4,943,827
[45] Date of Patent: Jul. 24, 1990

[54] METHOD AND APPARATUS FOR CONTROLLING EXPOSURE OF AN IMAGING SHEET

[75] Inventors: William G. Good; Mark E. Holycross, both of Centerville, Ohio

[73] Assignee: The Mead Corporation, Dayton, Ohio

[21] Appl. No.: 344,185

[22] Filed: Apr. 27, 1989

[51] Int. Cl.$^5$ .............................................. G03B 27/52
[52] U.S. Cl. ...................................... 355/30; 355/27; 355/35; 355/77
[58] Field of Search ...................... 355/27, 32, 35, 38, 355/30, 77, 68, 69; 430/138; 354/301, 299

[56] References Cited

U.S. PATENT DOCUMENTS 4,853,743  8/1989  Nagumo et al. ............... 355/30 X
4,864,356  9/1989  Asano et al. .................. 355/30 X Primary Examiner—Richard A. Wintercorn
Attorney, Agent, or Firm—Thomas A. Boshinski

[57] ABSTRACT

A method and apparatus form visible images in an imaging media which exhibits variation in sensitivity and color balance as a function of temperature and humidity changes. The media includes a substrate having provided on one of its surfaces a layer of microcapsules containing an image forming agent and a photohardenable composition. In the apparatus, a radiation source provides one or more bands of actinic radiation for exposing the substrate. An optical system focuses the actinic radiation onto the substrate to form a latent image thereon. A developing device develops the latent image into a visible image onto the substrate or onto a receiver substrate. A temperature and/or humidity sensor is provided for sensing the temperature and/or humidity exposure environment prior to exposure. An exposure control responsive to the sensors(s) controls the duration of the exposure at least partially as a function of temperature and/or humidity.

29 Claims, 2 Drawing Sheets

METHOD AND APPARATUS FOR CONTROLLING EXPOSURE OF AN IMAGING SHEET

BACKGROUND OF THE INVENTION

The present invention relates generally to an imaging system utilizing imaging sheets having a surface coating of rupturable photosensitive microcapsules and, more particularly, to a method and apparatus for controlling the exposure of the imaging sheets for more precise image reproduction.

U.S. Pat. Nos. 4,440,846 and 4,399,209, hereby incorporated by reference, describe an imaging system wherein a photosensitive layer comprising microcapsules containing a photosensitive composition in the internal phase is imagewise exposed to actinic radiation and subjected to a uniform rupturing force whereupon the microcapsules rupture and imagewise release the internal phase. The imaging system is particularly advantageous because it is a totally dry system and does not rely upon the application of wet developing processing solutions to produce the image. An image-forming chromogenic material, such as a substantially colorless color former, is typically associated with the microcapsules. When the microcapsules rupture, the color former imagewise reacts with a developer material and produces a color image. In the embodiments described in the referenced patents, the microcapsules are typically ruptured by passing imagewise exposed imaging sheets through the nip formed between a pair of parallel calendar rolls.

The media may exist in either single-sheet or two-sheet versions. In the former case, the microcapsules and developer composition are both coated onto a single substrate layer. In the latter case, the microcapsules are carried on a first substrate layer referred to as a donor sheet. The developer composition is coated onto a second, separate substrate layer referred to as a receiver sheet. The donor sheet is subjected to the actinic radiation, and the exposed microcapsule layer is then brought into contact with the developer layer of the receiver sheet. The two sheets are then developed by pressure, with the finished image being formed in the receiver sheet.

The disclosed imaging system may be designed to produce color images. In such case, three or more different types of capsules may be present on the sheet. Each is responsive to a different wavelength of exposure radiation and contains color formers designed to produce different colors upon subsequent development. Disclosure of such systems is made in U.S. Pat. No. 4,576,891 and U.S. Pat. application Ser. No. 339,917 filed Jan. 18, 1982.

U.S. Pat. application Ser. No. 262,545 filed Oct. 25, 1988, discusses a phenomenon exhibited by the imaging media known as short time scale reciprocity failure. Absent this effect, it would be expected that the imaging media would exhibit a substantially linear relationship between exposure time and exposure intensity. However, at short exposure times, the media exhibits a dramatic loss in sensitivity. As noted in the application, this effect can be greatly diminished by lowering the temperature of the imaging media as it is exposed.

The referenced application also notes that variation in media temperature can affect sensitometric behavior of the media such as film speed, contrast, dynamic range and the like. Thus, the media and/or an imaging apparatus with which the media is to be used may be designed to correspond to characteristics of the media exhibited at a particular temperature. As temperature varies from an optimized value, the quality of image produced on the media or by the apparatus may be degraded.

Similar effects may be observed due to variations in relative humidity. The media and/or the imaging apparatus may be designed to operate optimally at a particular relative humidity, with variations in humidity affecting the quality of the image produced.

A further problem is encountered when using a color media. The different microcapsules corresponding to different color formers exhibit varying degrees of temperature and/or humidity related changes. Thus, the media may be designed to operate at a particular optimum temperature and/or humidity level, whereat the different color microcapsules exhibit predictable behavior. As temperature and/or humidity changes, the sensitivity of the different microcapsules may change to different extents, thereby affecting the color balance or perceived hue of the color image.

SUMMARY OF THE INVENTION

To avoid these problems, the present invention provides a method and apparatus for forming visible images in an imaging media which exhibits variation in sensitivity and color balance as a function of environmental conditions during media exposure, particularly temperature and humidity changes. The media includes a substrate having provided on one of its surfaces a layer of microcapsules containing an image forming agent and a photohardenable composition.

The apparatus includes a radiation source operable to provide one or more bands of actinic radiation for exposing the substrate to the one or more bands. An optical system focuses the bands of actinic radiation onto the substrate to form a latent image thereon. A developing device is also provided for developing the latent image into a visible image onto the substrate or onto a receiver substrate.

A temperature sensor means is provided for sensing the temperature of the substrate or ambient air prior to exposure. Exposure control means is responsive to the temperature sensor means for controlling the duration of the exposure at least partially as a function of the temperature.

In accordance with an alternate embodiment, the apparatus includes humidity sensor means for sensing the humidity level of the ambient air around the substrate prior to exposure. The exposure control means then controls the duration of the exposure at least partially as a function of the humidity.

As yet a further alternative, a sensor means may be provided for sensing the temperature of the substrate or ambient air, and/or humidity of the ambient air prior to exposure. An optical filter means is provided which is responsive to the sensor means for positioning an appropriate filter within the optical system, filter selection being made as a function of temperature and/or humidity.

Sensors for other environmental conditions could be used.

Corresponding methods are also provided.

Accordingly, it is an object of the present invention to provide a method and apparatus for imaging an imaging sheet of a type described above, wherein consistent image quality, and in particular consistent color balance, can be maintained despite ambient temperature and/or humidity which differs from one exposure to a next; to provide such a method and apparatus which achieves such results despite ambient temperature and/or humidity which differs from an optimal temperature and/or humidity for which the media was designed; to provide such a method and apparatus which performs such function by controlling the exposure source to compensate for changes in temperature or humidity; and to provide such a method and apparatus which performs such function by controlling optical filtering of the exposure beam in accordance with temperature and/or humidity.

Other objects and advantages of the present invention will be apparent from the following description, the accompanying drawings and the appended claims.

DETAILED DESCRIPTION OF THE PREFERRED EMBODIMENTS

Figure 1A:
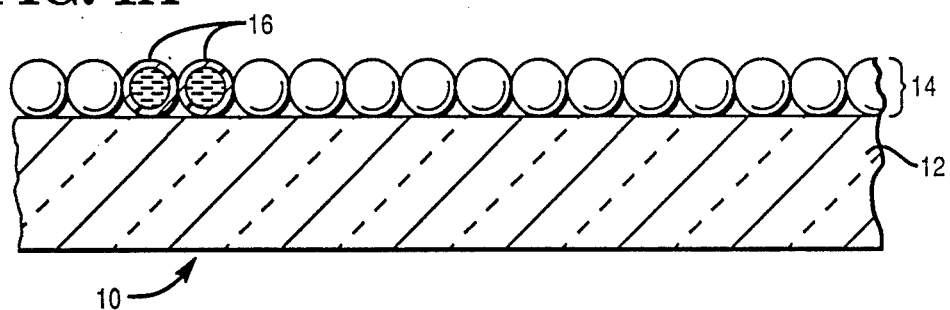
FIGS. 1A–1C show an example of an imaging media which is used within the present invention.

While describing the preferred embodiments, specific terminology will be utilized for the sake of clarity. It is to be understood that such terminology includes not only the recited embodiments, but all technical equivalents which perform substantially the same function in substantially the same way to obtain the same result.

To initiate the process according to the present invention, an imaging sheet must be provided. The imaging sheet has coated on one of its surfaces a layer of microcapsules. The microcapsules contain a photohardenable composition including a radiation curable composition and a photoinitiator. Photohardenable compositions such as photopolymerizable and photocross-linkable materials increase in viscosity or solidify upon exposure to radiation. The photoinitiators selected are typically those which are photosensitive and able to generate free radicals to initiate polymerization of the photopolymerizable or cross-linkable material. In association with the microcapsules is an image-forming agent.

Various radiation sensitive materials, photoinitiators and image-forming agents can be used in conjunction with the photosensitive materials of the present invention.

Ethylenically unsaturated organic compounds are useful radiation curable materials. These compounds contain at least one terminal ethylene group per molecule. Typically, they are liquid. Polyethylenically unsaturated compounds having two or more terminal ethylene groups per molecule are preferred. An example of this preferred subgroup is ethylenically unsaturated acid esters of polyhydric alcohols, such as trimethylol propane triacrylate (TMPTA) and dipentaerythritol hydroxypentaacrylate (DPHPA).

A preferred photoinitiator system for use in the present invention includes ionic dye-counter ion compounds described in European Application Publication No. 0 233 587. A preferred class of ionic dye-counter ions is cationic dye borates and still more particularly cyanine dye borates. Typically the borate is a triphenylalkyl borate such as a triphenylbutyl borate. Other dye complexes such as Rose Bengal iodonium and Rose Bengal pyryllium complexes may also be used.

Examples of other photoinitiators potentially useful in the present invention may be selected from among diaryl ketone derivatives, quinones, benzoin alkyl ethers, alkoxy phenyl ketones, O-acylated oximinoketones, polycyclic quinones, phenanthrenequinone, naphthoquinone, diisopropylphenanthenequinone, benzophenones and substituted benzophenones, xanthones, thioxanthones, halogenated compounds such as chlorosulfonly and chloromethyl polynuclear aromatic compounds, chlorosulfonyl and chloromethyl heterocyclic compounds, chlorosulfonyl and chloromethyl benzophenones and fluourenones, haloalkanes and bishexaryl imidiazoles. In many cases it is advantageous to use a combination with imaging photoinitiators.

Initiators including the ionic dye complexes may preferably include an autoxidizer. Suitable examples include N,N-dialkylanilines as described in the European Publication.

Various image-forming agents can be used in association with the radiation curable composition. For example, images can be formed by the interaction of color formers and color developers of the type conventionally used in the carbonless paper art. In addition, images can be formed by the color producing interaction of a chelating agent and a metal salt or by the reaction of certain oxidation-reduction reaction pairs, many of which have been investigated for use in pressure-sensitive carbonless papers. Alternatively, an oil soluble dye can be used and images can be formed by transfer to plain or treated paper. The internal phase itself has its own image-forming capability. For example, it is known that many of the toners used in xerographic recording processes selectively adhere to the image areas of an imaging sheet exposed and developed as in the present invention.

Furthermore, the image-forming agent can be provided inside the microcapsules, in the microcapsule wall, or outside the microcapsules in the same layer as the microcapsules or in a different layer. In the latter cases, the internal phase picks up the image-forming agent (e.g., by dissolution) upon being released from the microcapsules and carries it to the developer layer or an associated developer sheet.

Typical color precursors useful in the aforesaid embodiments include colorless electron donating type compounds. Representative examples of such color formers include substantially colorless compounds having in their partial skeleton a lactone, a lactam, a sulfone, a spiropyran, an ester or an amido structure such as triarylmethane compounds, bisphenylmethan compounds, xanthene compounds, fluorans, thiazine compounds, spiropyran compounds and the like. Crystal Violet Lactone and Copikem X, IV and XI (products of Hilton-Davis Chemical Co.) are often used alone or in combination as color precursors in the present invention, as are commercially available cyan, magenta and yellow color forming agents.

The discrete wall microcapsules used in the present invention can be produced using known encapsulation techniques including coacervation, interfacial polymerization, polymerization of one or more monomers in an oil, etc. Representative examples of suitable wall-formers are water soluble polymers (see Green et al. U.S. Pat. Nos. 2,730,456 and 2,800,457), gum arabic, polyvinyl alcohol, carboxy-methyl-cellulose; resorcinol-formaldehyde wall-formers (see Hart et el. U.S. Pat. No. 3,755,190); isocyanate wall-formers (see Vasseliades U.S. Pat. No. 3,914,511); isocyanate-polyol wall-formers (see Kiritani et al. U.S. Pat. No. 3,796,669); urea-formaldehyde wall-formers, particularly urea-resorcinol-formaldehyde in which oleophilicity is enhanced by the addition of resorcinol (see Foris et al. U.S. Pat. Nos. 4,001,140; 4,087,376 and 4,089,802); and melamine-formaldehyde resin and hydroxypropyl cellulose (see commonly assigned Shackle U.S. Pat. No. 4,025,455). A melamine-formaldehyde capsule is particularly preferred.

The mean microcapsule size used in the present invention generally ranges from about 1 to 25 microns.

The most common substrate for imaging sheets in accordance with this invention is a plastic film or paper. The paper may be a commercial impact raw stock, or special grade paper such as cast-coated paper or chrome-rolled paper. The latter two papers are preferred when using microcapsules having a diameter between approximately 1 and 5 microns because the surface of these papers is smoother and therefore the microcapsules are not as easily embedded in the stock fibers. Transparent substrates such as polyethylene terephthalate and translucent substrates can also be used in this invention. Another preferred substrate for the microcapsules is aluminized Mylar TM (PET). The microcapsules can be located on either the top or bottom surface of a substrate to form an imaging sheet.

Figure 1B:
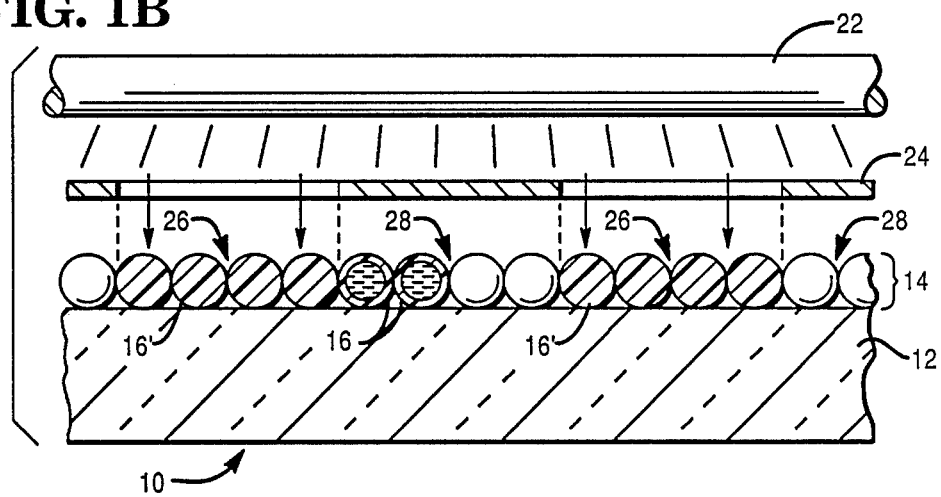
Figure 1C:
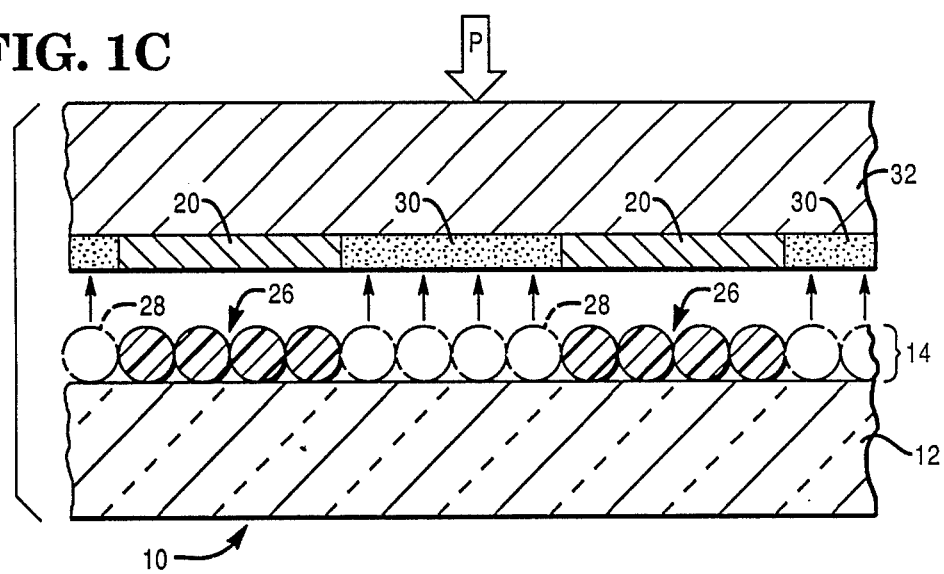

One example of the imaging media is shown in FIGS. 1A-1C. In FIG. 1A, an imaging sheet 10 is shown. The imaging sheet 10 is constituted by a substrate 12 coated with a layer of microcapsules 14. The microcapsules 14 are filled with an internal phase 16 containing the photosensitive composition. Usually, the microcapsules 14 also contain chromogenic material; however, as noted, the chromogenic material can be associated with the microcapsules 14 in other ways, such as by incorporation into the microcapsule wall wherein a layer contiguous with the microcapsules 14.

The exemplary imaging sheet is one part of a two-part imaging media, wherein a separate receiver sheet (see FIG. 1C) carries a layer of a developer material 20. The developer material 20, described in greater detail below, reacts with the chromogenic material and produces a colored image when the microcapsules 14 are ruptured.

Exposure of the imaging sheet 10 is shown in FIG. 1B wherein a source of actinic radiant energy 22 is positioned above the surface of the imaging sheet 10 with a mask 24 positioned therebetween. In the illustrations of FIGS. 1A-1C, the substrate 12 is opaque and the photosensitive material within the microcapsules 14 is a positive working radiation curable material, i.e., the viscosity of the material increases upon exposure to actinic radiation.

In the preferred embodiment, commercially available lasers or high intensity broad band sources capable of providing intensities between 1000 ergs/cm$^2$ and 32,000 ergs/cm$^2$ are preferred. Preferably, the radiation is in the infrared, visible or ultraviolet wavelengths.

The radiation of the exposed areas 26 causes the radiation curable composition and the internal phase 16 of the microcapsules 14 to polymerize, thereby gelling, solidifying or otherwise immobilizing the chromogenic material and preventing the chromogenic material from reacting with the developer material 20. To simplify the illustration, internal phase 16' in the exposed areas 26 is shown as a solid; whereas the internal phase 16 remains liquid in the unexposed areas 28.

After the image-wise exposure step, as shown in FIG. 1C, a developer sheet 32 is positioned against the imaging sheet 10. Sheet 32 carries thereon a developer material 20. The two sheets are together subjected to pressure to apply to the microcapsules a uniform rupturing force in the presence of the developer material so as to form an image.

Referring to FIG. 1C, the solidified microcapsules within the exposed areas 26 retain their contents, whereby no visible marking of the sheet within these regions will occur. In unexposed areas 28, the microcapsule contents will interact with the developer 20, thereby producing visibly marked areas 30 which together comprise the final image on sheet 32.

Where the image-forming agent is not a dye or pigment, the developer material is selected to react with the image-forming agent to form an image. Illustrative examples of color developers useful in conjunction with the embodiment employing the aforesaid color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxynaphthoate, zinc 3, 5-di-tert-butyl salicylate, oil soluble metal salts or phenol-formaldehyde novolak resins (e.g., see U.S. Pat. Nos. 3,672,935; 3,732,120 and 3,737,410) such as zinc modified oil soluble phenolformaldehyde resin as disclosed in U.S. Pat. No. 3,732,120, zinc carbonate etc. and mixtures thereof. A preferred class of glossable developers is described in commonly assigned U.S. application Ser. No. 073,036, filed July 14, 1987.

The developer material may be located on a support (not shown) separate from the imaging sheet to thereby form a transfer image coating system. In such a system, the imaging sheet and the developer sheet are brought together in the presence of a uniform rupturing force to cause the image-forming agent to migrate to the developer sheet and form an image on the developer sheet. The support may be made of paper, or a transparent film such as polyethylene terephthalate.

Alternatively, the developer material may be located on the same surface as the layer of microcapsules to form a self-contained sheet. In this configuration, the substrate is coated with a first coating of the photosensitive microcapsules. Alternatively, the microcapsules and developer material can be mixed and coated as a single layer as is readily understood in the art.

The manner in which the imaging material may be adapted for full color imaging is disclosed in U.S. Pat. No. 4,576,891 and U.S. Pat. application Ser. No. 339,917, filed Jan. 18, 1982, which are both hereby incorporated by reference. The substrate is coated with a layer of microcapsules which individually contain cyan, magenta and yellow color formers and photosensitive compositions which have distinctly different wavelength sensitivities. A uniform mixture of these microcapsules is distributed over the surface of the substrate. An image is formed by exposing the imaging sheet using different exposure wavelengths of actinic radiation to which the different photosensitive compositions are sensitive. This may be done sequentially by separately exposing color separations on to the media, or by exposing all colors simultaneously using a light source containing at least the exposure wavelengths required by the photosensitive compositions. Upon passing the material through the developer, the released color formers react with the developer material to produce a full color image.

In general, the system of the present invention compensates for variations in temperature and humidity by sensing the local temperature and humidity and adjusting the exposure time, and/or the color filtration, to values which will produce acceptable image results. This system may be incorporated into a relatively simple copying apparatus, such as that disclosed in U.S. Pat. Nos. 4,742,374 and 4,770,972. A schematic diagram of an imaging apparatus in accordance with the invention can be seen by reference to FIG. 2. (It should be understood that the term "imaging sheet" includes the imaging media described herein, whether processed in the form of a continuous web, individual cut sheets, or some other form.) The apparatus shown in FIG. 2 uses media of the two-part form, wherein a separate sheet carries the developer layer, with the finished image being produced on the receiver sheet.

Figure 2:
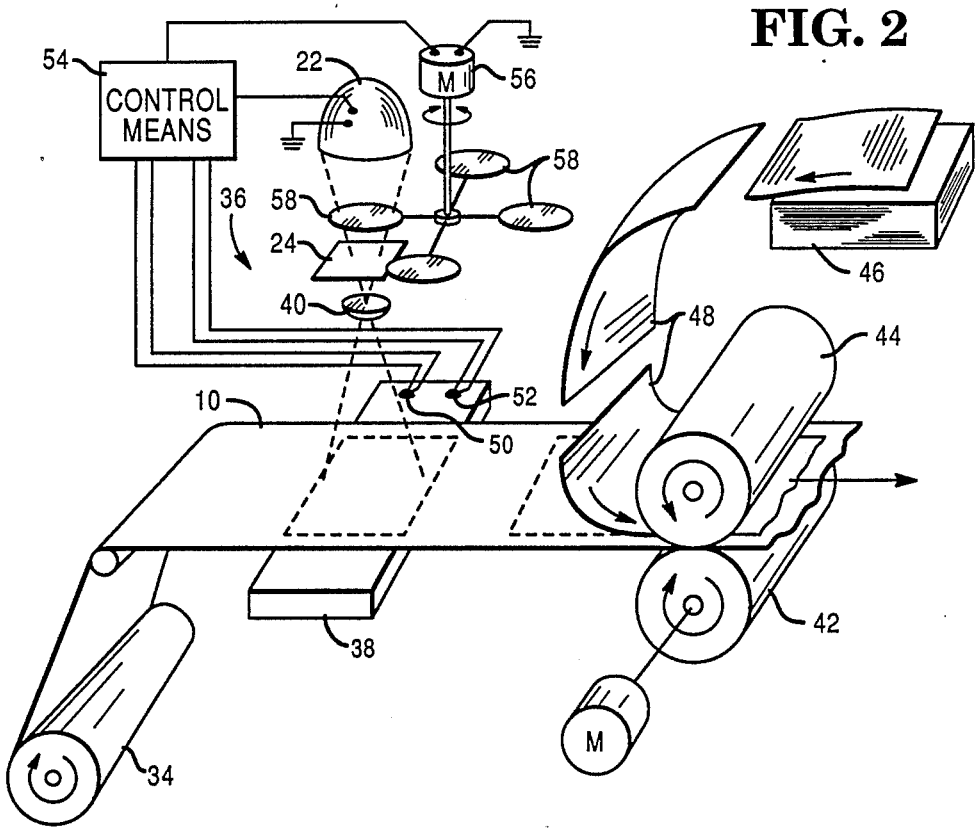
FIG. 2 is a schematic view of an imaging apparatus in accordance with the present invention.

The particular apparatus shown in FIG. 2 is intended for use with a web of imaging sheet material 10, such web being initially held within a storage roll 34. The material 10 passes from storage roll 34 into an exposure station 36 where the material is held on a supportive platen 38. The exposure source 22 is mounted above the platen 38, and the exposure radiation is directed through a mask 24 whereby the beam acquires the image information, with the beam then focused through a lens 40. In the embodiment described herein, the source 22 is a broad band source of actinic radiation, whereby a full color image may be made using only a single exposure beam.

After exposure, the imaging material web is directed toward a developer station. In the illustrated embodiment, the developer material is coated onto a separate receiver sheet. Such sheets are held within a supply stack 46, and individual sheets 48 are directed by an appropriate feed means (not shown) so as to be positioned on the imaging web in a face-to-face relationship. Such sheets are introduced at a location ahead of a pair of pinch rolls 42 and 44 comprising the developer means. The two-part sheet and web sandwich is passed between the nip of rolls 40 and 42, thereby causing development of the visible image.

To compensate for temperature and humidity variation, a temperature sensor 50 and a humidity sensor 52 are mounted within the exposure station 36. Such sensors 50 and 52 should be positioned sufficiently close to the area of web 10 which is to be exposed so as to give as accurate information as possible regarding the temperature and humidity conditions of the web environment during exposure. Any appropriate, commercially-available sensors may be used, with one example of temperature sensor 50 being a thermocouple and one example of humidity sensor 52 being a thin-film capacitance sensor. Sensors 50 and 52 are connected to a control means 54, whereby the data collected by sensors 50 and 52 may be used to control exposure of the media 10.

Sensors 50 and 52 are located within the exposure station to sense the environmental conditions therein. In the case of humidity sensor 52, the sensor may be mounted to platen 38, although mounting at some other location near the exposure site is also appropriate. In any case, sensor 52 is positioned so as to sense the relative humidity level of the air surrounding the media web 10. For temperature sensor 50, it is preferred that sensor 50 be located to sense the ambient air temperature. This may also be accomplished by mounting sensor 50 to platen 38, although sensor 50 may then also be affected by the platen temperature. Sensor 50 may also be located to sense the temperature of the web substrate, rather than air temperature. Specific sensor location may not be so critical, however, since in any case, as long as the sensors remain fixed in one location, the control means can be designed to produce an appropriate response.

Control means 54 may be used to adjust exposure time to compensate for temperature and/or humidity variation. In FIG. 2, control means 54 is shown directly coupled to exposure source 22, whereby the length of time during which source 22 is activated is regulated to control exposure time. It will be recognized by those skilled in the art that other means for controlling such time may be used, for example, a shutter means disposed within the path of the exposure beam or, where continuous exposure of a moving web is made, by controlling motor speed which drives the web. Moreover, the intensity of the source could also be controlled.

The present invention also provides for control of filtering of the exposure beam to regulate color balance in the resulting image. In the apparatus of FIG. 2, control means 54 is shown connected to a servo motor 56 which is used to position a selected one of a plurality of color filters 58 within the exposure beam path. While four filters are shown, any practical and/or desired numbers of filters 58 may be provided.

Figure 3:
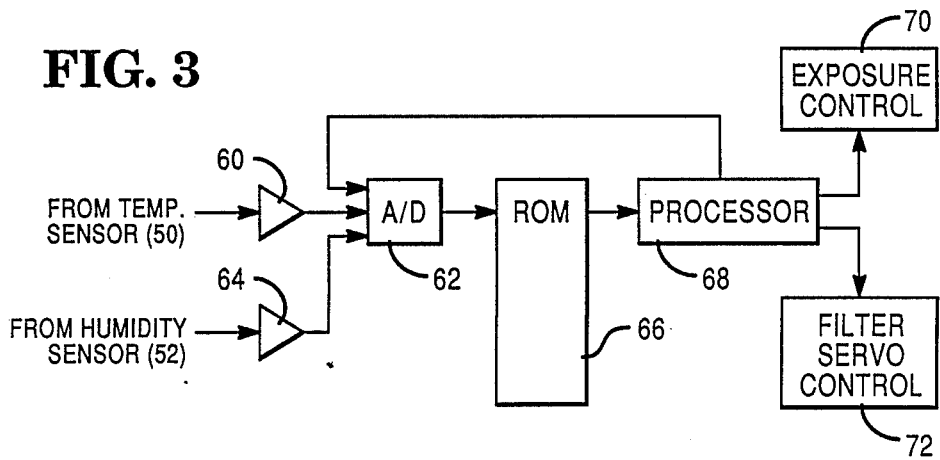
FIG. 3 is a schematic diagram of a control system for the apparatus.

Control means 54 is shown in greater detail in FIG. 3. Input from temperature sensor 50 is applied through amplifier 60 to an analog-to-digital converter 62. Similarly, input from humidity sensor 52 is amplified by amplifier 64 and applied to A-to-D converter 62. The digital signals corresponding to sensor inputs are next directed to a read only memory 66 which maps the temperature and humidity values to tables containing appropriate exposure times and filter values. The outputs from these tables are then directed to a processor 68 which uses the exposure time values and color filter values to instruct an exposure time control means 70 and a filter servo control means 72 during exposure of the imaging media. To reduce system fluctuations, A-to-D converter 62 may be triggered by processor 68 only upon receipt of an instruction from the system operator to produce an image. Alternatively, converter 62 may be triggered by a clock means (not shown) at an appropriate time interval.

The contents of memory 66 are predetermined for the range of temperature and humidity values expected in the environment in which the system will operate. All values contained within the tables of memory 66 may be determined empirically through experiments, or key values may be determined experimentally with remaining values being extrapolated.

While the method herein described, and the form of apparatus for carrying this method into effect, constitute preferred embodiments of this invention, it is to be understood that the invention is not limited to these precise methods and forms of apparatus, and that changes may be made in either without departing from the scope of the invention, which is defined in the appended claims.

What is claimed is:

1. An apparatus for producing images from an imaging sheet including a substrate having provided on one of its surfaces a layer of microcapsules containing an image-forming agent and a photohardenable composition, said apparatus comprising:

means for supporting said substrate at an exposure station;

a radiation source operable to provide one or more bands of actinic radiation for exposing said substrate to said one or more bands;

an optical system for focussing said one or more bands of actinic radiation onto said substrate at said exposure station to form a latent image on said substrate;

a developing device for developing the latent image into a visible image onto said substrate or onto a receiver substrate;

environmental sensor means for sensing at least one environmental condition within said exposure station prior to exposure; and exposure control means responsive to said environmental sensor means for controlling the amount of actinic radiation received by said substrate during said exposure at least partially as a function of said environmental condition.

2. The apparatus as defined in claim 1, wherein said exposure control means includes duration control means for controlling the duration of said exposure.

3. The apparatus as defined in claim 2, wherein said duration control means includes means for controlling the duration of actuation of said radiation source.

4. The apparatus as defined in claim 2, wherein said duration control means includes a shutter disposed to selectively block said actinic radiation, and means for controlling opening and closing of said shutter.

5. The apparatus as defined in claim 2, wherein said duration control means includes means for establishing an environmental condition value corresponding to said environmental condition, at least one memory table correlating said environmental condition value to an exposure duration value, and means for controlling the duration of said exposure in accordance with said exposure duration value.

6. The apparatus as defined in claim 1, wherein said exposure control means includes intensity control means for controlling the intensity of said actinic radiation received by said substrate.

7. The apparatus as defined in claim 1, wherein said one environmental condition is temperature.

8. The apparatus as defined in claim 1, wherein said one environmental condition is temperature of the sheet.

9. The apparatus as defined in claim 1, wherein said one environmental condition is relative humidity.

10. The apparatus as defined in claim 1, wherein said environmental sensor means includes a first sensor responsive to temperature and a second sensor responsive to relative humidity.

11. An apparatus for producing images from an imaging sheet including a substrate having provided on one of its surfaces a layer of microcapsules, first ones of said microcapsules containing a first image-forming agent and a first photohardenable composition sensitive to actinic radiation within a first wavelength band, and second ones of said microcapsules containing a second image-forming agent and a second photohardenable composition sensitive to actinic radiation within a second wavelength band, said apparatus comprising:

means for supporting said substrate at an exposure station;

a radiation source operable to provide actinic radiation including at least said first and second bands for exposing said substrate to said first and second bands;

an optical system for focussing said bands of actinic radiation onto said substrate at said exposure station to form a latent color image on said substrate;

a developing device for developing the latent image into a visible color image onto said substrate or onto a receiver substrate;

environmental sensor means for sensing at least one environmental condition within said exposure station prior to exposure;

color filter means disposed to receive said actinic radiation and for filtering said radiation by adjusting the relative wavelength content of said radiation;

filter control means responsive to said environmental sensor means for controlling the filtering of said radiation at least partially as a function of said environmental condition.

12. The apparatus as defined in claim 11, wherein said color filter means includes a plurality of color filter elements, and wherein said filter control means includes means for disposing a selected one of said elements to receive said radiation.

13. The apparatus as defined in claim 12, wherein said means for disposing said selected element includes means for mounting said elements, a servo motor connected to said mounting means for moving said mounting means with said selected element to receive said radiation.

14. The apparatus as defined in claim 11, wherein said filter control means includes means for establishing an environmental condition value corresponding to said environmental condition, at least one memory table correlating said environmental condition value to a filter control value, and means for controlling the filtering of said radiation in accordance with said filter control value.

15. The apparatus as defined in claim 11, wherein said one environmental condition is temperature.

16. The apparatus is defined in claim 11, wherein said one environmental condition is relative humidity.

17. A method for producing images from an imaging sheet, which sheet includes a substrate having provided on one of its surfaces a layer of microcapsules containing an image-forming agent and a photohardenable composition, said method comprising the steps of:

supporting said substrate at an exposure station;

sensing at least one environmental condition within said exposure station;

generating one or more bands of actinic radiation;

focussing said one or more bands of actinic radiation onto said substrate at said exposure station for exposing said substrate to said one or more bands to form a latent image on said substrate;

controlling the amount of actinic radiation received by said substrate during said exposure at least partially as a function of said environmental condition; and developing the latent image into a visible image onto said substrate or onto a receiver substrate.

18. The method as defined in claim 17, wherein said controlling of the amount of said actinic radiation is performed by controlling the duration of said exposure.

19. The method as defined in claim 18, wherein said radiation is generated by a radiation source, and wherein duration of said exposure is controlled by controlling the duration of actuation of said radiation source.

20. The method as defined in claim 18, wherein said radiation is generated by a radiation source, and wherein duration of said exposure is controlled by disposing a shutter to selectively block said actinic radiation, and by controlling opening and closing of said shutter.

21. The method as defined in claim 18, wherein said duration control is performed by establishing an environmental condition value corresponding to said environmental condition, correlating using at least one memory table said environmental condition value to an exposure duration value, and controlling the duration of said exposure in accordance with said exposure duration value.

22. The method as defined in claim 17, wherein said amount of actinic radiation is controlled by controlling the intensity of said actinic radiation received by said substrate.

23. The method as defined in claim 17, wherein said one environmental condition is temperature.

24. The method as defined in claim 17, wherein said one environmental condition is relative humidity.

25. A method for producing images from an imaging sheet, which sheet includes a substrate having provided on one of its surfaces a layer of microcapsules, first ones of said microcapsules containing a first image-forming agent and a first photohardenable composition sensitive to actinic radiation with a first wavelength band, and second ones of said microcapsules containing a second image-forming agent and a second photohardenable composition sensitive to actinic radiation with a second wavelength band, said method comprising the steps of:

supporting said substrate at an exposure station;

sensing at least one environmental condition within said exposure station;

generating actinic radiation including at least said first and second bands;

filtering said actinic radiation to adjust the relative wavelength content of said radiation;

controlling the filtering of said radiation at least partially as a function of said environmental condition.

focussing said bands of actinic radiation onto said substrate at said exposure station for exposing said substrate to said bands to form a latent color image on said substrate; and developing the latent image into a visible color image onto said substrate or onto a receiver substrate.

26. The method as defined in claim 25, wherein said filtering is performed using a plurality of color filter elements, and wherein said filter control includes disposing a selected one of said elements to receive said radiation.

27. The method as defined in claim 25, wherein said filtering control is performed by establishing an environmental condition value corresponding to said environmental condition, correlating using at least one memory table said environmental condition value to a filter control value, and controlling the filtering of said radiation in accordance with said filter control value.

28. The method as defined in claim 25, wherein said one environmental condition is temperature.

29. The method as defined in claim 25, wherein said one environmental condition is relative humidity.

* * * * *